United States Patent [19]

Shen

[11] Patent Number: 6,001,684
[45] Date of Patent: Dec. 14, 1999

[54] METHOD FOR FORMING A CAPACITOR

[75] Inventor: Hua Shen, Beacon, N.Y.

[73] Assignee: Siemens Aktiengesellschaft, Munich, Germany

[21] Appl. No.: 08/868,555

[22] Filed: Jun. 4, 1997

[51] Int. Cl.⁶ .............................................. H01L 21/8242
[52] U.S. Cl. ........................... 438/246; 438/249; 438/392
[58] Field of Search ..................................... 438/561–563, 438/243–256, 386–396

[56] References Cited

U.S. PATENT DOCUMENTS

| | | | |
|---|---|---|---|
| 4,355,454 | 10/1982 | Tasch, Jr. et al. | 29/571 |
| 5,618,751 | 4/1997 | Golden et al. | 438/392 |
| 5,770,484 | 6/1998 | Kleinhenz | 438/155 |

*Primary Examiner*—Jey Tsai
*Attorney, Agent, or Firm*—Stanton C. Braden

[57] ABSTRACT

A method for forming a capacitor in a semiconductor body is provided. The method includes the step of forming a trench in a portion of a surface of the semiconductor body. The trench having sidewalls and a bottom. A doped film is deposited over the surface of the semiconductor body. Portions of the doped film are deposited over the sidewalls and bottom of the trench. The semiconductor body is heated and the doped film to produce a liquid phase interface region therebetween while diffusing dopant in the doped film into a region of the semiconductor body. The interface region is cooled to return such interface region to a solid phase. The doped film and the interface region are removed from the semiconductor body while leaving the doped region in the semiconductor body. A dielectric film is deposited over the doped region of the semiconductor body. A doped material is deposited over the dielectric film, the doped material and the doped region in the semiconductor body providing electrodes for the capacitor and the dielectric film providing a dielectric for the capacitor. The heating and cooling steps comprise the steps of: subjecting the semiconductor body and doped film to an energized source of radiant heat to heat such body and doped film and subsequently de-energizing the energized source of radiant heat to cool the doped semiconductor body and doped film. The cooling is at a rate sufficiently rapid to avoid formation of silicon arsenic precipitate.

24 Claims, 9 Drawing Sheets

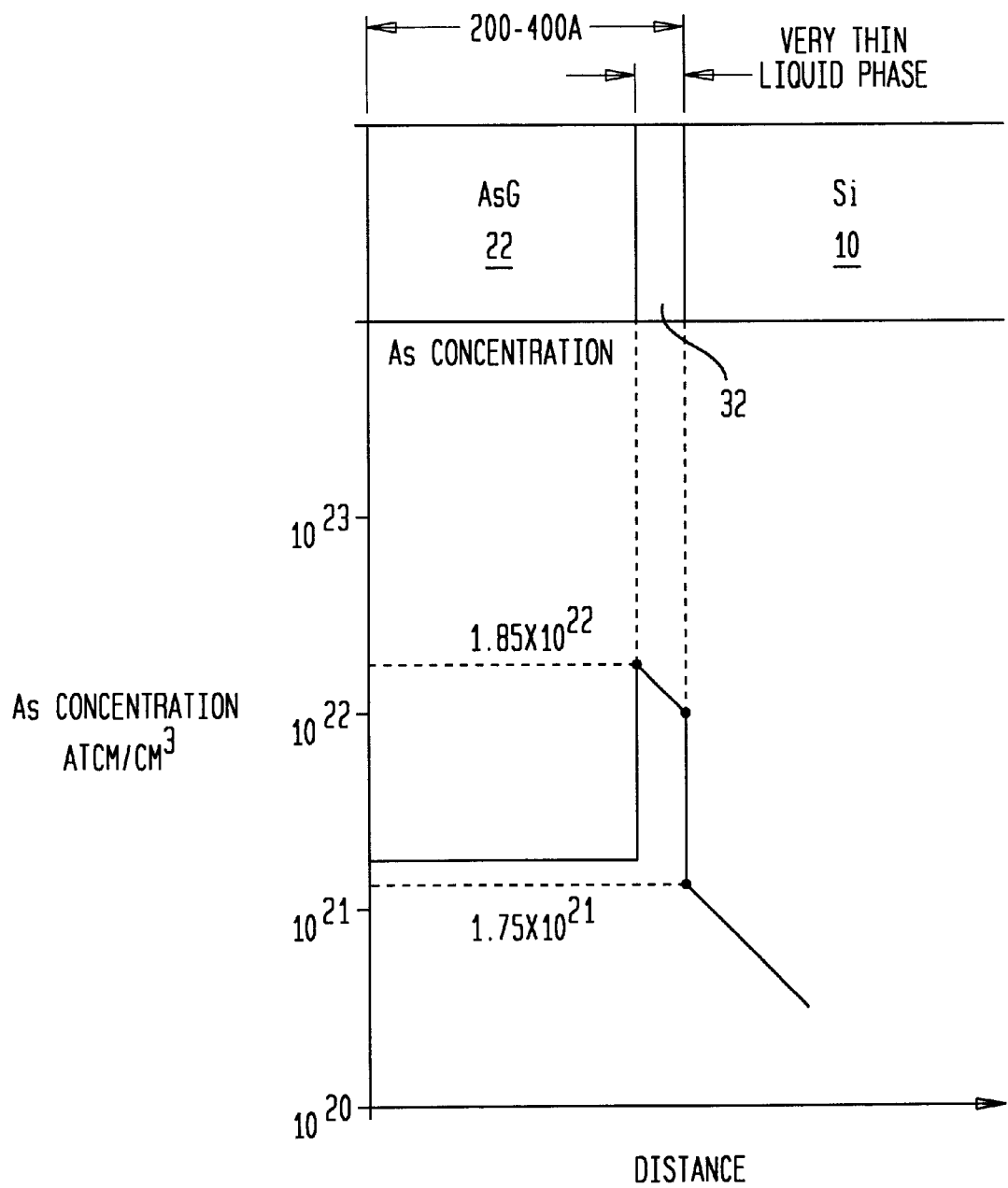

METHOD FOR FORMING A CAPACITOR

BACKGROUND OF THE INVENTION

This invention relates generally to integrated circuit manufacturing methods and more particularly to methods used in fabricating dynamic random access memories (DRAMs).

As is known in the art, DRAMs are being used extensively in a wide range of application. A DRAM typically includes as an array of memory cells, each cell comprising a metal oxide semiconductor field effect transistor (MOSFETs) and electrically connected capacitor. When the cell is addressed, a logic state, such as a logic 1 state, is stored as a charge its capacitor.

One technique used to form the capacitor is to etch a trench in a semiconductor, typically silicon, substrate. A pad layer, typically about 500 Angstroms thick, of silicon dioxide is thermally grown over the silicon substrate. A thicker, typically 2000–10000 Angstrom mask layer of silicon nitride is then formed over the pad layer. A window is formed in a portion of the silicon nitride layer and through the underlying portion of the pad layer. The trench is then etched into the underlying, exposed portion of the silicon substrate. The trench has a depth of typically in the order of 8 microns and a width of about a quarter micron. A layer of doped, typically arsenic doped, glass (i.e., arsenic doped silicon oxide) is chemically vapor deposited in the trench (i.e., on the sidewalls and bottom of the trench) to a thickness of about 800 A. The doping concentration of the arsenic is typically $2 \times 10^{21}$ atoms/cm$^3$. The structure is then placed in a convection furnace to perform a high temperature anneal. The anneal is carried out at a temperature of about 1050° C. for about 30–60 minutes. The temperature in the furnace increases at a rate of about 4° C. per minute. During the anneal process a portion of the dopant, i.e., arsenic, is diffused from the arsenic layer into the adjacent sidewalls and bottom of the silicon. Thus, an arsenic doped region is formed in the adjacent silicon substrate, providing one of the trench plate capacitor. This plate is referred to as the buried plate. The arsenic concentration in the buried plate is about $5 \times 10^{19}$ atoms/cm$^3$. The furnace is then turned off and the temperature in the furnace cools at a rate of about 5° C. per minute. The arsenic doped glass is removed from the trench using, for example, buffered hydrofluoric acid (HF). Arsenic doped polycrystalline silicon (poly), having a doping concentration of about $1 \times 10^{20}$ atoms/cm$^3$, is then chemically vapor deposited into the trench, i.e., over a dielectric layer formed on the sidewalls and bottom of the silicon substrate. The doped poly serves as the second plate of the capacitor. Thus, a capacitor is formed; the arsenic doped region in the silicon substrate and the doped polycrystalline silicon providing the plates (i.e., electrodes) of the capacitor and the silicon nitride dielectric layer providing the dielectric of the capacitor. The MOSFET is then formed on the substrate adjacent to the trench with the source/drain region of the MOSFET electrically connected to the doped polycrystalline silicon to thereby electrically connect the MOSFET to the capacitor and provide a DRAM cell.

The capacitance of the capacitor is related to the conductivity of its electrodes. Thus, one way to increase the capacitance is to increase the conductivity of one, or both, of the electrodes. As noted above, the arsenic doped glass is doped with a concentration of $2 \times 10^{21}$ atoms/cm$^3$. Further, it is desirable to reduce the size of the capacitor in order to increase the number of cell which may be formed on a chip.

However, if the size of the capacitor were reduced by reducing the diameter of the trench, say to a diameter of about 0.15 microns, if the same thickness is used for the arsenic doped glass (i.e., 800 A), since the trench is somewhat tapered, the doped glass will fill the bottom portion of the trench. Thus, the glass layer will be thicker at the bottom portion of the trench than at the sidewalls of the trench. Consequently, when the wet chemical etch is used to remove the glass layer, because the etch rate is the same for both the thicker bottom portion of the glass as the thinner sidewall portion of the glass, the etch time required to remove the bottom portion of the glass will remove portions of the pad silicon oxide layer and produce additional adverse effects to the structure.

SUMMARY OF THE INVENTION

In accordance with one feature of the invention, a method for forming a capacitor in a semiconductor body is provided. The method includes the step of forming a trench in a portion of a surface of the semiconductor body. A doped film is deposited over the surface of the semiconductor body. Portions of the doped film are deposited over the sidewalls and bottom of the trench. The semiconductor body and the doped film are heated to produce a liquid phase interface region therebetween while diffusing dopant in the liquid phase interface region into a region of the semiconductor body. The interface region is cooled to return such interface region to a solid phase. The cooling is at a rate sufficiently rapid to avoid formation of silicon arsenic precipitate. The doped film and the interface region are removed from the semiconductor body while leaving the doped semiconductor body. A dielectric film is deposited over the doped semiconductor body. A doped material is deposited over the dielectric film. The doped material and the doped semiconductor body provide electrodes for the capacitor and the dielectric film provides a dielectric for the capacitor.

In accordance with another feature of the invention, the heating and cooling steps comprise the steps of: subjecting the semiconductor body and doped film to an energized source of radiant heat to rapidly heat such body and doped film to diffuse dopant in the doped film through the interface region into a region of the semiconductor body to thereby formed the doped region in the semiconductor body and subsequently de-energizing the energized source of radiant heat to rapidly cool the doped semiconductor body and doped film. The cooling is at a rate sufficiently rapid to avoid formation of silicon arsenic precipitate.

In accordance with another feature of the invention, a method for forming a capacitor of a DORM cell is provided. The cell comprises the capacitor and an electrically connected transistor. The method includes the step of heating a semiconductor body and a doped film deposited thereon to produce a liquid phase interface region therebetween while diffusing dopant into a region of the semiconductor body. The interface region is cooled to return such interface region to a solid phase. The doped region in the semiconductor body provides one electrode of the capacitor. A dielectric film is formed over the doped region in the semiconductor body. The dielectric film provides a dielectric of the capacitor. A doped material is deposited over the dielectric film. The doped material provides a second electrode for the capacitor.

In accordance with another feature of the invention, a method is provided for forming a capacitor of a DRAM cell. The cell includes the capacitor and an electrically connected transistor. The method includes the steps of heating a silicon body and an arsenic doped glass layer disposed on a surface portion of the silicon body to a temperature of at least 1097° C. and subsequently cooling such silicon body and arsenic doped glass layer forming an arsenic doped region in the portion of the silicon. The arsenic doped region provides an electrode for the capacitor. A dielectric film is formed over the arsenic doped region. The dielectric film provides a dielectric for the capacitor. A doped material is disposed over the dielectric film to provide another electrode for the capacitor.

With such method, a thinner arsenic doped glass, in the order of 200 A, or less, may be used thereby enabling the formation of trenches with diameters in the order of 0.15, or less, microns. Further, using the present method of heating the structure to 1050° C. for 30–60 minutes, a solid phase diffusion takes place between arsenic doped glass and the silicon substrate. However, using a temperature of 1097° C., or greater, during the anneal, an arsenic doped glass-silicon substrate interface will be in liquid phase and the diffusion of the arsenic dopant will take place when the silicon substrate interface is in its liquid phase thereby increasing the diffusion rate between the arsenic dopant in the doped glass and the silicon substrate. The interface, being in the liquid state, will result in increased doping concentration in the silicon substrate. The doping concentration at the surface will be at least $2 \times 10^{20}$ atoms per $cm^3$ using this liquid phase diffusion transfer.

Further, a rapid thermal heating and cooling is used. The heating and cooling rates are in the order of 100° C. per second. The heating source is a radiant energy source and an argon atmosphere is used to 1150° C. for 60 seconds after which the structure is removed from the heating source. The cool-down must be rapid in order to prevent the liquid phase interface to become solid and thus allow arsenic to diffuse back to glass film to form silicon-arsenic (SiAs) precipitates. That is, the cooling is at a rate sufficiently rapid to avoid formation of silicon arsenic precipitates.

More particularly, the heating and cooling steps comprise the steps of: subjecting the semiconductor body and doped film to an energized source of radiant heat to heat such body and doped film and form the doped region in the semiconductor body and subsequently de-energizing the energized source of radiant heat to cool the now doped region in the semiconductor body and doped film.

BRIEF DESCRIPTION OF THE DRAWING

Other features of the invention, as well as the invention itself, will become more readily apparent when taken together with the accompanying drawings, in which:

FIG. 2 is a sketch showing the As concentration of an As doped glass layer, liquid phase interface region, and silicon substrate.

DETAILED DESCRIPTION

Figure 1A:
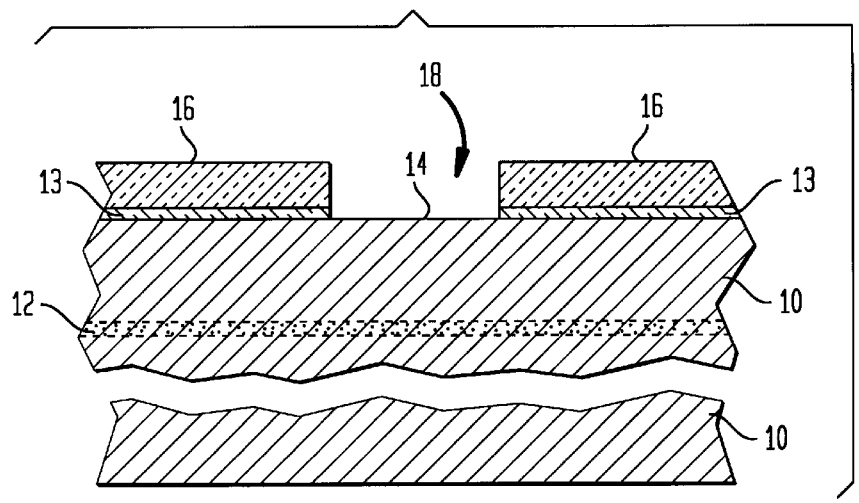
FIGS. 1A–1Q diagrammatical cross-sectional sketches of a DRAM cell as various stages in the fabrication thereof in accordance with the invention.

Referring now to FIG. 1A, a semiconductor body, here a silicon substrate 10, is shown having a buried ion implanted layer 12, here phosphorous doped layer formed therein at a depth of here 4 microns from the upper surface 14 of the silicon substrate 10. The doping concentration of the buried doped layer 12 here has a dosage of about $10^{12}$ to $10^{14}$ per $cm^2$. A pad layer 13 of silicon dioxide, here about 500 Angstroms thick, is thermally grown over the upper surface 14 of he silicon substrate 10. A dielectric layer 16, here a 2000 to 10000 Angstroms thick layer of silicon nitride and/or silicon dioxide is disposed on the upper surface of the silicon dioxide pad layer 13, as shown.

Subsequently, as shown in FIG. 1A, a window 18 formed is formed in the silicon nitride layer 16 using conventional photolithographic chemical etching techniques. The windowed silicon nitride layer 16 is used as a mask to etch a trench 20 into an underlying portion of the upper surface 14 of the silicon substrate 10 using conventional etching techniques. Here, the depth of the trench 20 is in the order of 8 microns from the upper surface 14 of the silicon substrate 10, and the width of the trench 20 may be in the order of 0.10 microns to one-quarter micron.

Figure 1B:
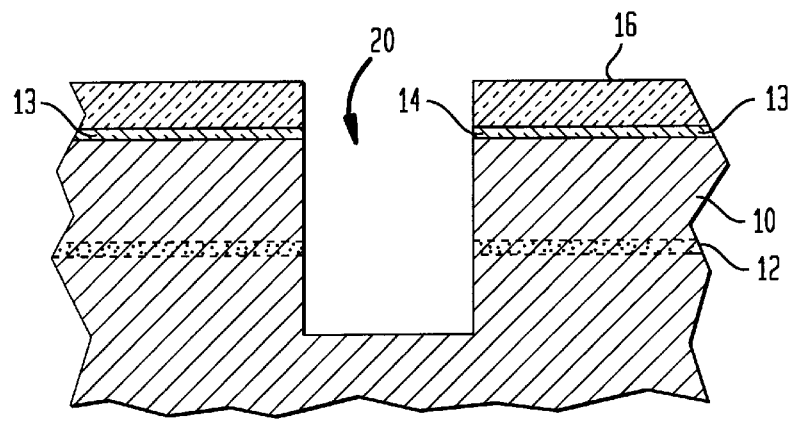
Figure 1C:
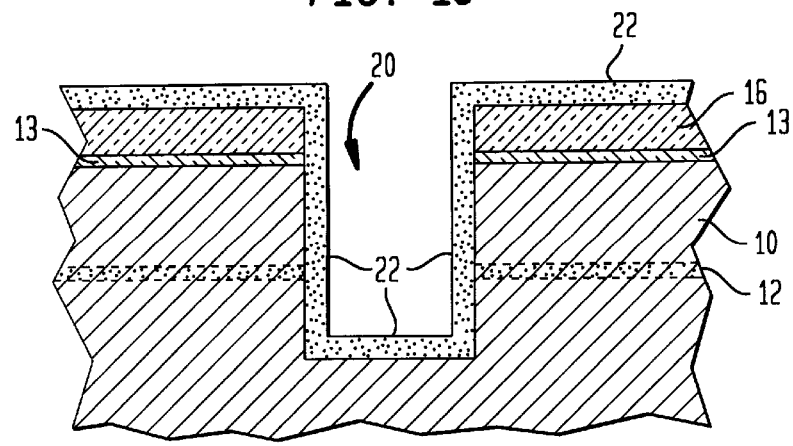

Referring to FIG. 1C, a film, or layer 22 of arsenic doped glass (AsG) is chemically vapor deposited over the structure shown in FIG. 1B. Here, the thickness of the film 22 is 200–400 Angstroms and the doping concentration of arsenic is $2 \times 10^{21}$ atoms/$cm^3$.

Figure 1D:
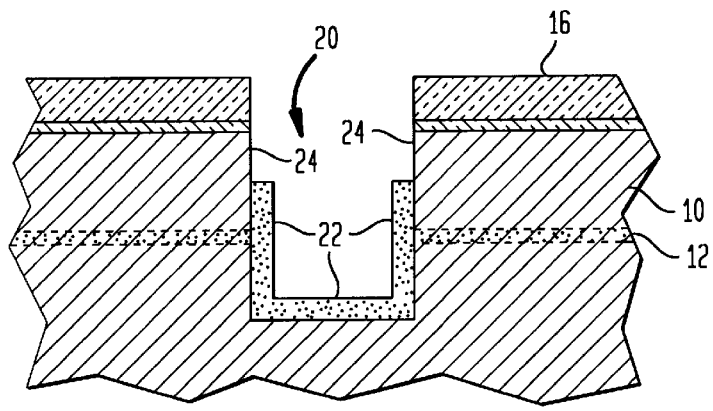

Referring to FIG. 1D, the upper portions of the AsG film 22 are removed using a wet chemical etchant, here buffered HF. Thus, upper portions 24 of the silicon substrate trench 20 sidewalls are exposed, as shown.

Figure 1E:
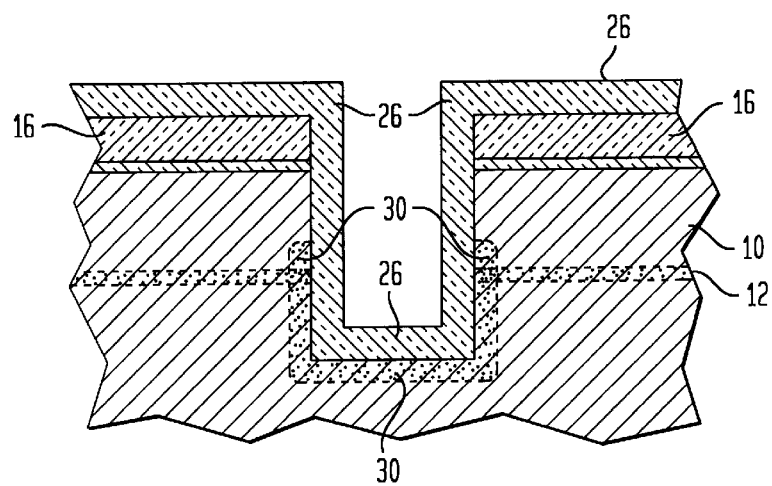

Referring to FIG. 1E, the structure shown in FIG. 1D is annealed to form the buried plate of the capacitor. To prevent autodoping of the dopants, a dielectric layer such as TEOS is deposited over the substrate, covering the surface and trench sidewalls. In one embodiment, a rapid thermal anneal is performed at a high temperature for a short period of time. The temperature is sufficiently high to cause the Si/AsG interface to be transformed into liquid phase. Typically, the duration of a rapid thermal anneal is about 1–2 minutes.

The rapid thermal anneal is performed in a rapid thermal processing furnace. Rapid thermal furnace, for example, uses a lamp as its heating source. As such, the structure is annealed using a source of radiant energy. The temperature in the furnace is increased rapidly until it reaches the desired temperature. Typically, the ramp rate is in the order of 100° C. per second.

In one embodiment, the structure is annealed at a temperature of at least 1097° C. or greater. Such a temperature is sufficient to cause the Si/AsG interface to be in liquid state. The duration of the RTA is in the order of seconds. Typically, the duration of the RTA is about 60–120 seconds.

Conventional annealing of the AsG is performed at a temperature of about 1050° C. Under these conditions, solid state diffuision of As occurs. The typcial concentration of As in Si achieved under solid state diffusion is about $5 \times 10^{19}$ atoms/$cm^3$. It is believed that the precipitation of SiAs and low diffusivity of As in the As doped glass prevents achieving a higher concentration.

However, in accordance with the invention, the diffusion of As is preformed at a temperature of at least about 1097° C. or greater. At such a temperature, diffusion of As into Si is in the liquid phase. Under liquid phase diffusion, the concentration of As is significantly greater than that achieved with solid state diffusion, which is only about $5 \times 10^{19}$ atoms/$cm^3$. This is because a very small amount of As rich liquid phase forms at the interface between the As doped glass layer and the silicon substrate at about 1097° C. or greater. The As liquid phase has about 37 atomic percent of As, as compared to 4 atomic percent for solid AsG.

FIG. 2 is a sketch showing the As concentration of As doped glass layer 22, liquid phase interface region 32 (FIG. 2), and silicon substrate 10. The liquid phase interface region 32 not only provides much higher As concentration, but also much higher As diffusivity. The diffusivity in liquid phase on average is a few orders higher than in a solid phase interface region. As a result, the As concentration at the surface of the silicon substrate 10 (i.e., in As doped region 30, FIG. 1E) will be approximately $1.75 \times 10^{21}$ atoms/cm$^3$, theoretically. The total amount of As diffused to the silicon substrate 12 will be much more than with solid state diffusion. Therefore, the As concentration both inside and at the surface of the silicon substrate 10 (i.e., in doped regions 30) will increase a large amount. (It is noted that, because only a small amount of the arsenic doped glass is needed to form this liquid phase interface region, the thickness of the arsenic doped glass layer can be greatly decreased.)

During the subsequent cooling down period, (i.e., after the thermal anneal), SiAs might precipitate from the liquid phase. Therefore, a rapid thermal process (RTP) or fast thermal process (FTP) is used to perform the liquid phase diffusion (i.e., more particularly, a radiant heating source is used because of their more rapid cooling rate (i.e,, the heat is remove when the radiant source, (e.g. lamp) is turned off. That is, the cooling is at a rate sufficiently rapid to avoid formation of silicon arsenic precipitates.

Figure 3:
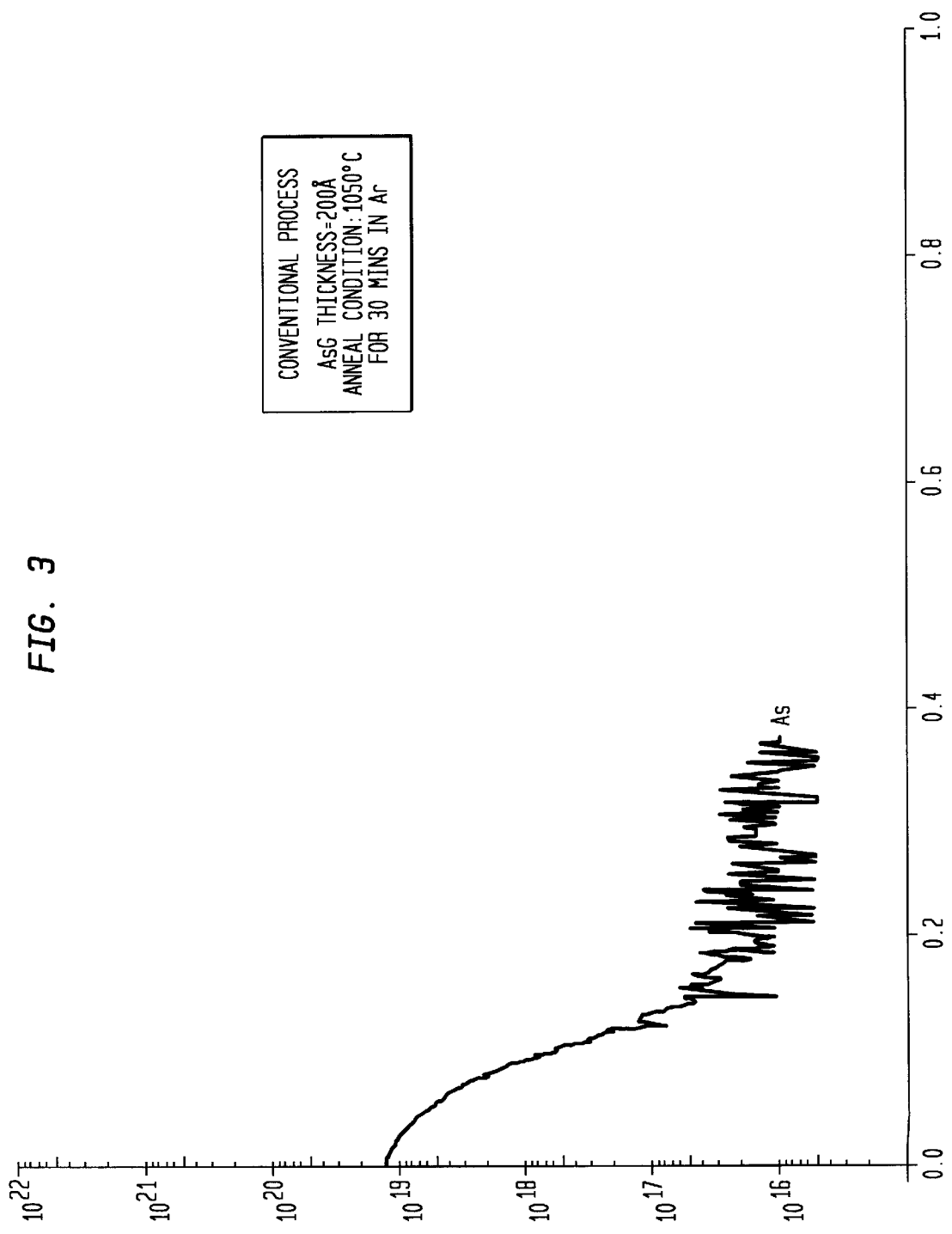
FIG. 3 is a plot of As concentration in silicon using conventional anneal process.

FIG. 3 plots the As concentration achieved in Si using conventional anneal. The conventional anneal was performed on a AsG film of about 200 Å thick at a temperture of about 1050° C. for about 30 minutes in an Ar ambient. The As concentration in the AsG film is about $2 \times 10^{21}$ atoms/cm$^3$. From FIG. 3, the concentration of As at the Si sidewalls under these conditions is about $2 \times 10^{19}$ atoms/cm$^3$. As you move into the bulk of the silicon to about 0.4 microns, the concentration of As decreases to about $1 \times 10^{15}$ atoms/cm$^3$.

Figure 4:
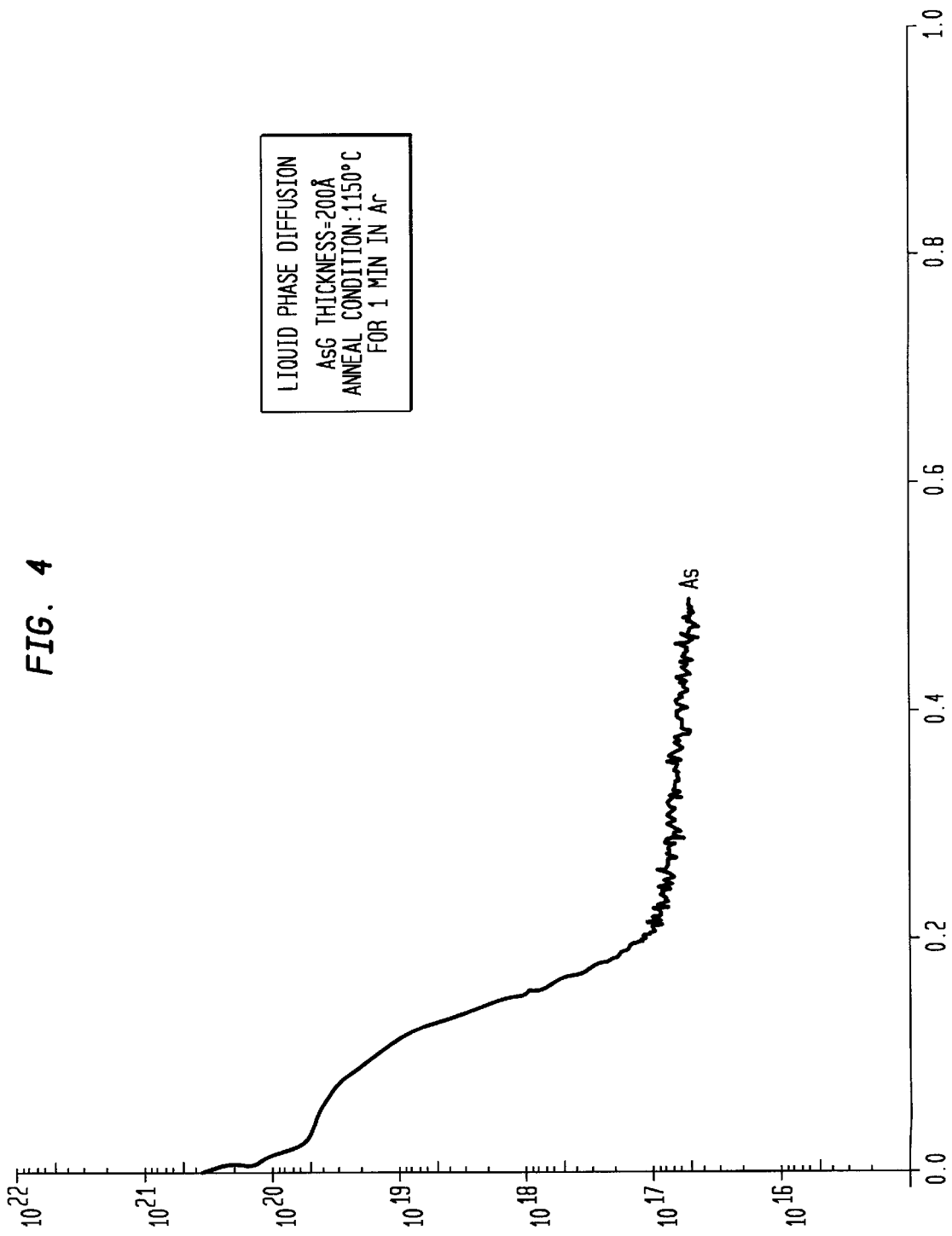
FIG. 4 is a plot of As concentration in silicon using an anneal process in accordance with the invention.

FIG. 4 plots the As concentration achieved in Si using a RTA in accordance with the invention. The anneal was performed on a AsG film similar to that in FIG. 3 at a temperature of about 1150° C. for about 1 minutes in an Ar ambient. The As concentration in the Si achieved under these conditons is about $4 \times 10^{20}$ atoms/cm$^3$ at the sidewalls and decreases to about $1 \times 110^{17}$ atoms/cm$^3$ at 0.4 microns from the sidewalls. Thus, by performing the anneal at least at a temperature of 1097° C. or greater, a significantly higher concentration of As in the buried plate is achieved.

Referring now to FIG. 1E, after the heating and cooling steps described above, the remaining doped glass layer 22 (FIG. 1D) is removed using buffered hydrofluoric acid (HF). A dielectric layer 26, here a 40–50 A thick layer, or film, of silicon nitride is chemically vapor deposited over the upper surface of the structure, as shown. It is noted that the deposited silicon dielectric layer is disposed over the arsenic doped regions 30. It is also noted that the arsenic ion implanted region 12 passes through, and is therefore electrically connected to, the arsenic doped regions 30.

Figure 1F:
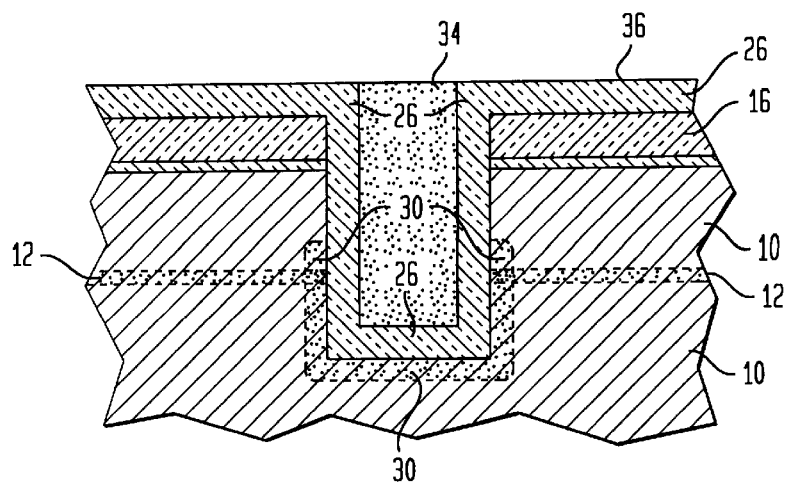

Referring now to FIG. 1F, a layer 34 of arsenic doped polycrystalline silicon is chemically vapor deposited (CVD) over the upper surface of the structure, such layer 34 completely filling the trench. Upper portions of the CVD doped polycrystalline silicon layer 34 are removed using chemical mechanical polishing (CMP) so that the upper surface of the polycrystalline layer 34 is level with the upper surface 36 of the silicon nitride layer 26, as shown in FIG. 1F.

Figure 1G:
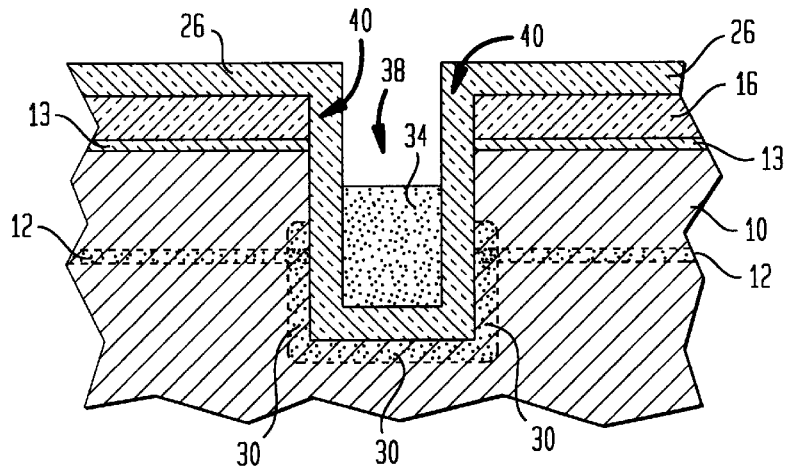

An upper portion of the doped polycrystalline silicon layer 34 is removed using, for example, reactive ion etching (RIE) techniques to produce the structure shown in FIG. 1G. It is noted that portion 40 of the thin silicon nitride layer disposed on the upper sidewalls of the trenches are exposed.

Figure 1H:
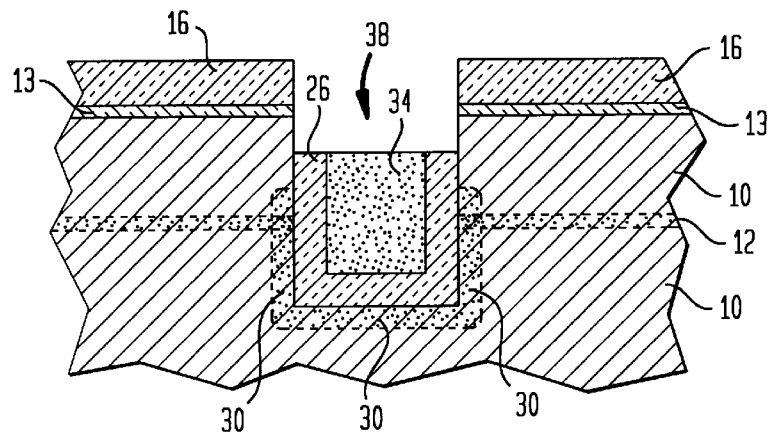

The exposed portions 40 of the silicon nitride layer 26 are remove using dilute hydrofluoric acid to produce the structure shown in FIG. 1H. (It is noted that the etch will remove a small amount of the silicon nitride mask 16; however the thickness of the mask 16 is much thicker (e.g., 2,000 to 10,000 Angstroms compared to the thickness of the portions 40 (e.g., 50 Angstroms).

Figure 1I:
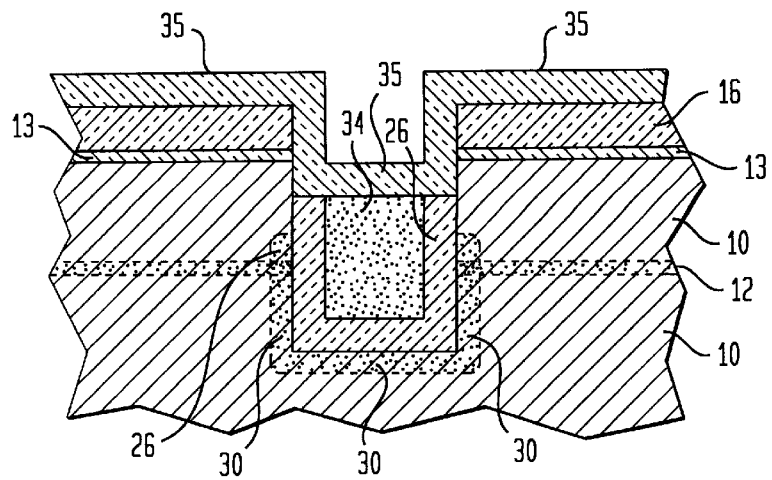

Referring now to FIG. 1I, A dielectric layer 35 is chemically vapor deposited over the upper surface of the structure as shown. The dielectric layer comprises, for example, a silicon dioxide layer or a silicon dioxide with a TEOS layer formed thereon. The layer 35 here has a thickness of about 300 Angstroms.

Figure 1J:
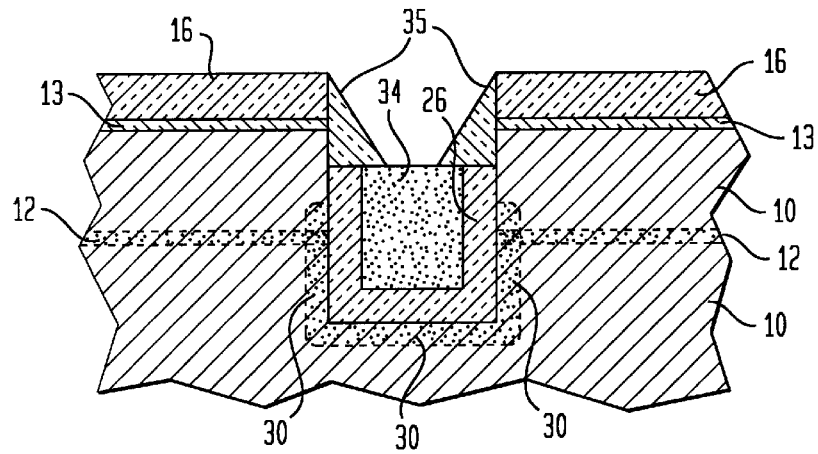

Upper portions of layer 35 are removed using reactive ion etching (RIE) to thereby leave only a collar region on the sidewalls of the trench, as shown in FIG. 1J.

Figure 1K:
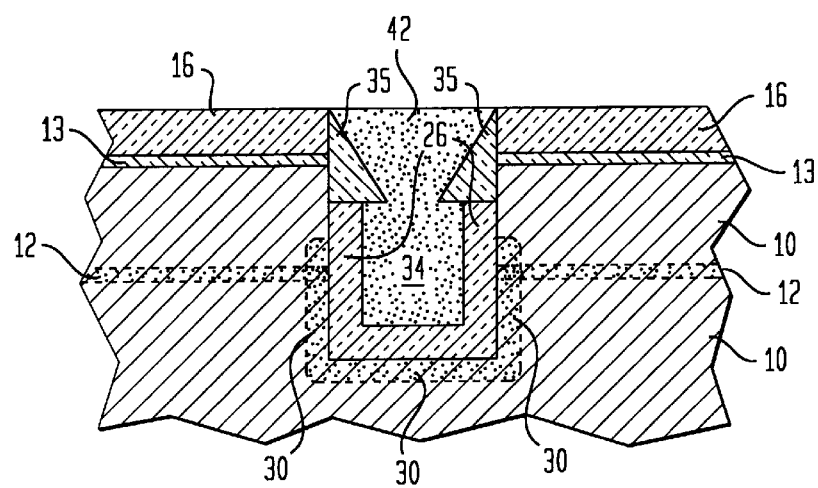

Next, a layer 42 of arsenic doped polycrystalline silicon is deposited using CVD to again fill the trench 38, excess doped polycrystalline silicon being again removed using CMP. The resulting structure is shown in FIG. 1K.

Figure 1L:
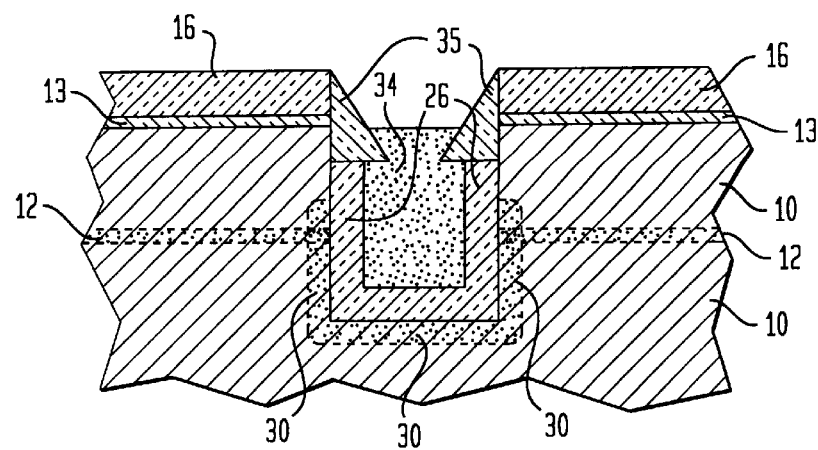

Next, reactive ion etching is used to remove upper portions of the doped polycrystalline silicon, resulting in the structure shown in FIG. 1L.

Figure 1M:
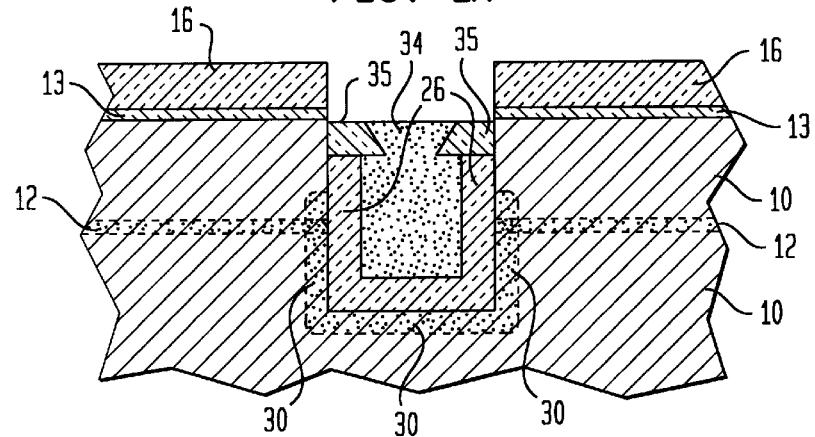

Next, a wet chemical etch is used to remove upper portions of the collar region silicon dioxide, producing the structure shown in FIG. 1M.

Figure 1N:
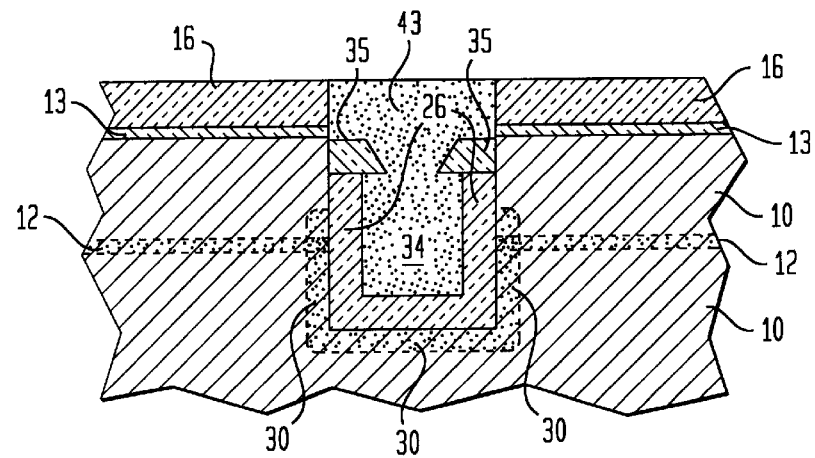

Next, a layer 43 of arsenic doped polycrystalline silicon is deposited using CVD to again fill the trench 38, excess doped polycrystalline silicon being again removed using CMP. The resulting structure is shown in FIG. 1N.

Figure 1O:
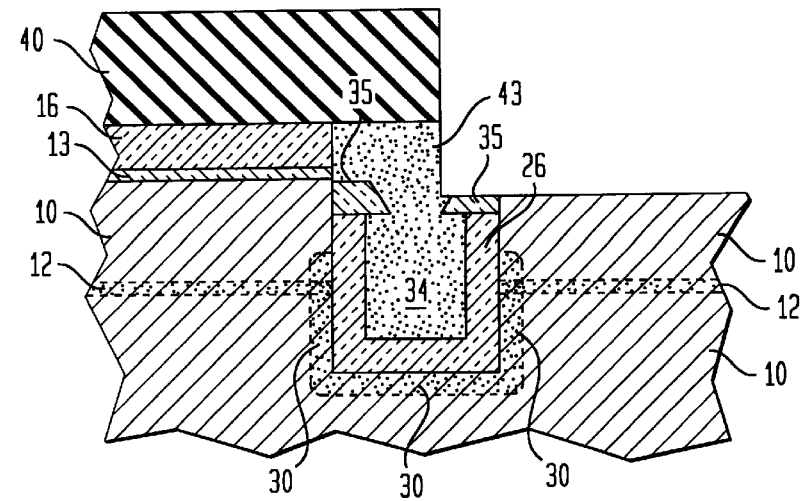

Referring to FIG. 1O, a layer of photoresist 40 is deposited over the upper surface of the structure and patterned using photolithography to expose a portion of the filled trench and an adjacent portion of the silicon nitride layer 16. The patterned photoresist layer 40 is used as a etch mask and the portions of the doped polycrystalline silicon layer 43, silicon dioxide pad layer 13 and silicon nitride mask layer 16 exposed by the patterned photoresist layer 40 are etched away to form the structure shown in FIG. 1O.

Figure 1P:
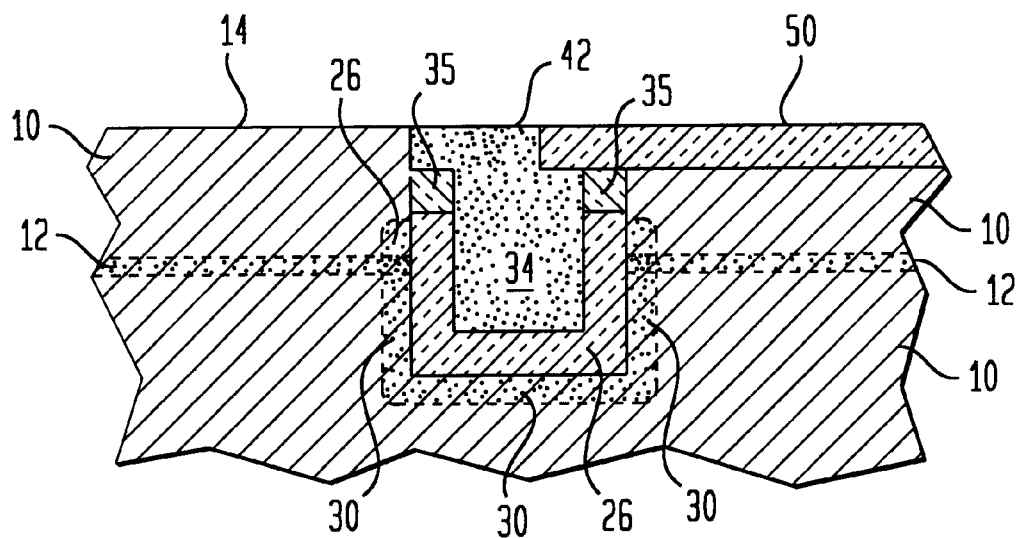
Figure 1Q:
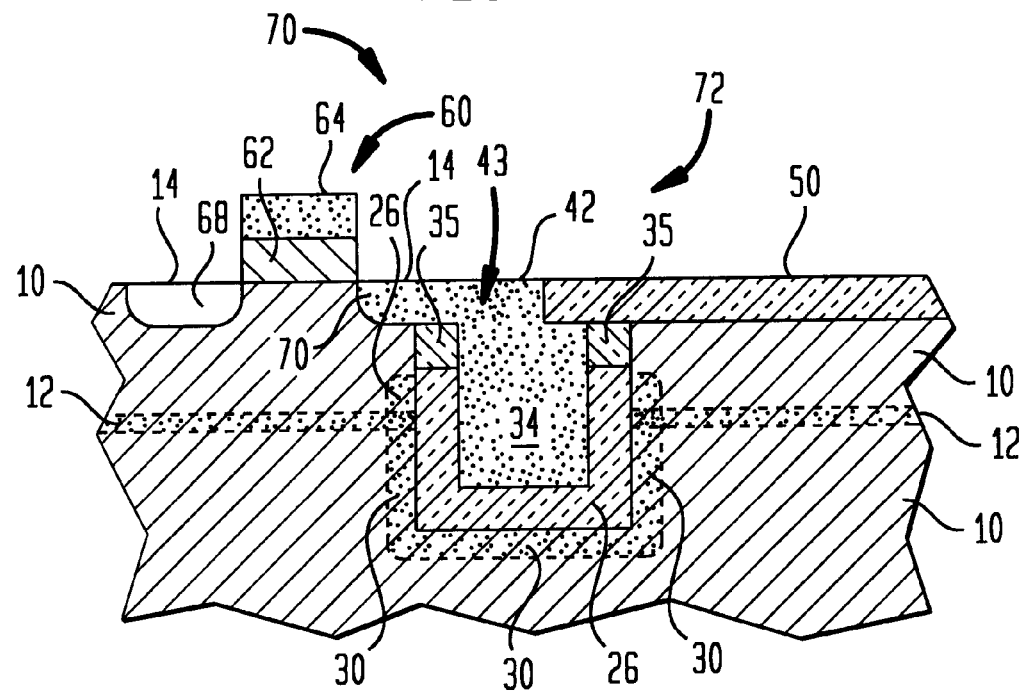

The photoresist layer 40 is remove and a layer 50 of chemically vapor deposited silicon dioxide is deposited over the upper surface of the structure. Upper portions of the CVD silicon dioxide layer 50 are removed using CMP. The silicon nitride layer 16, adjacent portions of the doped polycrystalline silicon layer 42 and underlying pad oxide layer 13 are removed using photolithographic-etching techniques to produce the structure shown in FIG. 1P. The upper surface 14 of the silicon substrate 10 is exposed and then processed to form an MOSFET transistor 60 having a thermally grown gate oxide 62 and doped polycrystalline gate 64 with source/drain regions 68, 70 as shown in FIG. 1Q. It is noted that the one of the source/drain regions 68, 70 here region 70 is electrically connected to the doped polycrystalline silicon material (i.e., layers 34, 42, 43) in the trench 20. It is also noted that the arsenic doped regions 30 formed in the silicon substrate 10 are electrically connected to the buried phosphorous ion implanted doped region 12. The buried ion implanted region 12 enables electrical connection to the arsenic doped regions 30 formed in the silicon substrate 10. Thus, a DRAM cell 70 is formed having the MOSFET 60 electrically connected to a capacitor 72, the capacitor 72 having a pair of electrodes provided by the arsenic doped regions 32 formed in the silicon substrate 10 and the doped polycrystalline silicon layers 34, 42, 43 formed in the trench, such electrode, or plates, being separated by the silicon nitride dielectric layer 26.

Other embodiments are within the spirit and scope of the appended claims.

What is claimed is:

1. A method for forming a capacitor, comprising the steps of:

heating a semiconductor body comprising a doped film deposited thereon to produce a liquid phase interface region therebetween while diffusing dopant in the doped film into a region of the semiconductor body; and cooling the interface region to return such interface region to a solid phase, such doped region in the semiconductor body providing one electrode of the capacitor;

forming a dielectric film over the doped region, such dielectric film providing a dielectric of the capacitor; and depositing a doped material over the dielectric film, the doped material providing a second electrode for the capacitor.

2. A method for forming a capacitor, comprising the steps of:

(a) heating a semiconductor body and a doped film deposed thereon to produce a liquid phase interface region therebetween while diffusing dopant in the doped film into a region of the semiconductor body; and (b) cooling the interface region to return such interface region to a solid phase, such doped semiconductor body providing one electrode of the capacitor;

(c) forming a dielectric film over the doped region; such dielectric film providing a dielectric of the capacitor;

(d) depositing a doped material over the dielectric film, the doped material providing a second electrode for the capacitor; and wherein the cooling is at a rate sufficiently rapid to avoid formation of silicon arsenic precipitate.

3. The method recited in claim 2 wherein the heating and cooling steps comprise the steps of: subjecting the semiconductor body and doped film to an energized source of radiant heat to heat such body and doped film and subsequently de-energizing the energized source of radiant heat to cool the body and doped film.

4. A method for forming a capacitor in a semiconductor body, comprising the step of:

forming a trench in a portion of a surface of the semiconductor body, such trench having sidewalls and a bottom;

depositing an doped film over the surface of the semiconductor body, portions of the doped film being deposited over the sidewalls and bottom of the trench;

heating the semiconductor body and the doped film to produce a liquid phase interface region therebetween while diffusing dopant in the liquid interface region into a region of the semiconductor body;

cooling the interface region to return such interface region to a solid phase;

removing the doped film from the semiconductor body and solid phase interface region while leaving the doped region in the semiconductor body;

depositing a dielectric film over the doped region of the semiconductor body;

depositing a doped material over the dielectric film, the doped material and the doped region in the semiconductor body providing electrodes for the capacitor and the dielectric film providing a dielectric for the capacitor; and wherein the heating and cooling steps comprise the steps of: subjecting the semiconductor body and doped film to an energized source of radiant heat to heat such body and doped film and subsequently de-energizing the energized source of radiant heat to cool the body and doped film.

5. A method for forming a capacitor of a DRAM cell, such cell comprising the capacitor and an electrically connected transistor, such method comprising the steps of:

(a) heating a semiconductor body and a doped film deposited thereon to produce a liquid phase interface region therebetween while diffusing dopant in the doped film into a region of the semiconductor body; and (b) cooling the interface region to return such interface region to a solid phase, such doped semiconductor body providing one electrode of the capacitor;

(c) forming a dielectric film over the doped region, such dielectric film providing a dielectric of the capacitor; and (d) depositing a doped material over the dielectric film, the doped material providing a second electrode for the capacitor; and wherein the cooling is at a rate sufficiently rapid to avoid formation of silicon arsenic precipitate.

6. A method comprising the steps of:

(a) heating a semiconductor body and a doped film deposited thereon to produce a liquid phase interface region therebetween while diffusing dopant in the doped film into a region of the semiconductor body; and (b) cooling the interface region to return such interface region to a solid phase;

wherein the body comprises silicon and the doped film comprises arsenic; and wherein the cooling is at a rate sufficiently rapid to avoid formation of silicon arsenic precipitate.

7. The method recited in claim 6 wherein the heating and cooling steps comprise the steps of: subjecting the semiconductor body and doped film to an energized source of radiant heat to heat such body and doped film and subsequently de-energizing the energized source of radiant heat to cool the body and doped film.

8. The method recited in claim 7 wherein the doped film comprises arsenic doped glass and wherein the semiconductor body comprises silicon and wherein the silicon body and the arsenic doped glass layer disposed on a surface portion of the silicon body are heated to a temperature of at least 1097° C. and subsequently cooled.

9. The method recited in claim 8 wherein the body and the doped film are cooled at a rate sufficiently rapid to avoid formation of silicon arsenic precipitate.

10. The method recited in claim 8 wherein the heating and cooling steps comprise the steps of: subjecting the semiconductor body and doped film to an energized source of radiant heat to heat such body and doped film and subsequently de-energizing the energized source of radiant heat to cool the body and doped film.

11. A method for forming a capacitor, comprising the steps of:

(a) heating a semiconductor body and a doped film deposited thereon to a temperature of at least 1097 degrees Centigrade for a period of time less than a few minutes to produce a liquid phase interface region therebetween while diffusing dopant in the doped film into a region of the semiconductor body; and (b) cooling the interface region to return such interface region to a solid phase, such doped semiconductor body providing one electrode of the capacitor;

(c) forming a dielectric film over the doped region, such dielectric film providing a dielectric of the capacitor; and (d) depositing a doped material over the dielectric film, the doped material providing a second electrode for the capacitor.

12. The method recited in claim 11 wherein the heating is for a period of time of about one to two minutes.

13. The method recited in claim 12 wherein the heating increases temperature at a rate in the order of 100 degrees Centigrade per second.

14. The method recited in claim 11 wherein the heating and cooling steps comprise the steps of: subjecting the semiconductor body and doped film to an energized source of radiant heat to heat such body and doped film and subsequently de-energizing the energized source of radiant heat to cool the body and doped film.

15. A method for forming a capacitor, comprising the steps of:

(a) heating a semiconductor body and a doped film deposited thereon to a temperature at a temperature of at least 1097 degrees Centigrade for a period of time less than a few minutes to produce a liquid phase interface region therebetween while diffusing dopant in the doped film into a region of the semiconductor body; and (b) cooling the interface region to return such interface region to a solid phase, such doped semiconductor body providing one electrode of the capacitor;

(c) forming a dielectric film over the doped region, such dielectric film providing a dielectric of the capacitor; and (d) depositing a doped material over the dielectric film, the doped material providing a second electrode for the capacitor.

16. The method recited in claim 15 wherein the heating is for a period of time of about one to two minutes.

17. The method recited in claim 15 wherein the heating increases temperature at a rate in the order of 100 degrees Centigrade per second.

18. The method recited in claim 15 wherein the heating and cooling steps comprise the steps of: subjecting the semiconductor body and doped film to an energized source of radiant heat to heat such body and doped film and subsequently de-energizing the energized source of radiant heat to cool the body and doped film.

19. A method comprising the steps of:

(a) heating a semiconductor body and a doped film thereon to a temperature greater than at least 1097 degrees Centigrade for a period of time of less than a few minutes to produce a liquid phase interface region therebetween while diffusing dopant in the doped film into a region of the semiconductor body; and (b) cooling the interface region to return such interface region to a solid phase.

20. The method recited in claim 19 wherein the heating is for a period of time of about one to two minutes.

21. The method recited in claim 19 wherein the temperature of the heating increasing at a rate in the order of 100 degrees Centigrade per second.

22. The method recited in claim 19 wherein the heating and cooling steps comprise the steps of: subjecting the semiconductor body and doped film to an energized source of radiant heat to heat such body and doped film and subsequently de-energizing the energized source of radiant heat to cool the body and doped film.

23. The method recited in claim 22 wherein the doped film comprises arsenic doped glass and wherein the semiconductor body comprises silicon.

24. The method recited in claim 19 wherein the body and the doped film are cooled at a rate sufficiently rapid to avoid formation of silicon arsenic precipitate.

* * * * *